United States Patent
Jacob et al.

(10) Patent No.: US 9,589,849 B2
(45) Date of Patent: Mar. 7, 2017

(54) METHODS OF MODULATING STRAIN IN PFET AND NFET FINFET SEMICONDUCTOR DEVICES

(71) Applicants: GLOBALFOUNDRIES Inc., Grand Cayman (KY); International Business Machines Corporation, Armonk, NY (US)

(72) Inventors: Ajey Poovannummoottil Jacob, Watervliet, NY (US); Murat Kerem Akarvardar, Saratoga Springs, NY (US); Bruce Doris, Slingerlands, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 154 days.

(21) Appl. No.: 14/633,353

(22) Filed: Feb. 27, 2015

(65) Prior Publication Data
US 2016/0254195 A1 Sep. 1, 2016

(51) Int. Cl.
*H01L 21/8238* (2006.01)
*H01L 21/306* (2006.01)
*H01L 21/762* (2006.01)
*H01L 29/165* (2006.01)

(52) U.S. Cl.
CPC ........ *H01L 21/823821* (2013.01); *H01L 21/30604* (2013.01); *H01L 21/76224* (2013.01); *H01L 21/823807* (2013.01); *H01L 29/165* (2013.01)

(58) Field of Classification Search
CPC ....... H01L 21/12; H01L 21/762; H01L 29/06; H01L 21/66; H01L 21/823821; H01L 21/30604; H01L 21/76224; H01L 21/823807
See application file for complete search history.

(56) References Cited

U.S. PATENT DOCUMENTS

| | | | |
|---|---|---|---|
| 2011/0175166 A1* | 7/2011 | Bedell | H01L 21/845 257/351 |
| 2013/0062708 A1* | 3/2013 | Zhong | H01L 29/66545 257/401 |

* cited by examiner

*Primary Examiner* — Errol Fernandes
(74) *Attorney, Agent, or Firm* — Amerson Law Firm, PLLC

(57) ABSTRACT

One illustrative method disclosed herein includes, among other things, forming a plurality of initial fins that have the same initial axial length and the same initial strain above a substrate, performing at least one etching process so as to cut a first fin to a first axial length and to cut a second fin to a second axial length that is less than the first axial length, wherein the cut first fin retains a first amount of the initial strain and the cut second fin retains about zero of the initial strain or a second amount of the initial strain that is less than the first amount, and forming gate structures around the first and second cut fins to form FinFET devices.

19 Claims, 16 Drawing Sheets

US 9,589,849 B2

METHODS OF MODULATING STRAIN IN PFET AND NFET FINFET SEMICONDUCTOR DEVICES

BACKGROUND OF THE INVENTION

1. Field of the Invention

Generally, the present disclosure relates to the manufacturing of semiconductor devices, and, more specifically, to various methods of modulating strain in PFET and NFET FinFET semiconductor devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art FinFET semiconductor device 10 that is formed in a semiconductor substrate 12. The device 10 includes three illustrative fins 14, a gate structure 16, sidewall spacers 18 and a gate cap layer 20. The gate structure 16 is typically comprised of a layer of insulating material (not separately shown), e.g., a layer of high-k insulating material, and one or more conductive material layers (not separately shown) that serve as the gate electrode for the device 10. In this example, the fins 14 are comprised of a substrate fin portion 14A and an alternative fin material portion 14B. The substrate fin portion 14A may be made of silicon, i.e., the same material as the substrate, and the alternative fin material portion 14B may be made of a material other than the substrate material, for example, silicon-germanium. The fins 14 are typically formed by etching a plurality of trenches 13 into the substrate 12. A recessed layer of insulating material (not shown) is normally positioned in the trenches 13 between the fins 14. The fins 14 have a three dimensional configuration: a height H, a width W and an axial length L. The axial length L corresponds to the direction of current travel in the device 10 when it is operational. The portions of the fins 14 covered by the gate structure 16 are the channel regions of the FinFET device 10. In a conventional process flow, the portions of the fins 14 that are positioned outside of the spacers 18 correspond to the source/drain regions of the device 10.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. Device designers are currently investigating using alternative semiconductor materials, such as so-called SiGe, Ge and III-V materials, to manufacture FinFET devices which are intended to enhance the performance capabilities of such devices at a given supply voltage or to enable lower-voltage operation without degrading their operating speed. For P-type FinFET devices having a germanium-containing channel material, such as substantially pure germanium, the performance of such devices is increased if the channel material is compressively strained, while the performance of such P-type FinFET devices degrades if the channel material is under a tensile strain. Conversely, N-type FinFET devices can exhibit increased performance when formed using substantially unstrained SiGe or tensile strained material for the channel region. The problem is that, in traditional manufacturing techniques, fins for all of the devices (both N and P) are formed at the same time across the substrate so as to enable precise formation of the fins without concern for dimensional variations in the fins due to so-called etch loading effects. Thus, using prior art manufacturing techniques, the formation of, for example, germanium-containing fins with acceptable strain conditions for both N and P type devices is problematic.

The present disclosure is directed to various methods that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of modulating strain in PFET and NFET FinFET semiconductor devices. One illustrative method disclosed herein includes, among other things, forming a plurality of initial fins that have the same initial axial length and the same initial strain, performing at least one etching process so as to cut a first fin to a first axial length and to cut a second fin to a second axial length that is less than the first axial length, wherein the cut first fin retains a first amount of the initial strain and the cut second fin retains zero of the initial strain or a second amount of the initial strain that is less than the first amount, and forming gate structures around the first and second cut fins at the approximate center of the fins to form FinFET devices.

Another illustrative method disclosed herein includes, among other things, forming a plurality of initial fins that have the same initial axial length and the same initial strain, performing at least one etching process so as to cut a first fin to a first axial length and to cut a second fin to a second axial length that is less than the first axial length, wherein the cut first fin retains between about 65-90% of the initial strain and the cut second fin retains 0-40% of the initial strain, and wherein the cut second fin is in a substantially relaxed condition along a current transport direction of the cut second fin, and forming gate structures around the first and second cut fins at the approximate center of the fins to form FinFET devices.

Yet another illustrative method disclosed herein includes, among other things, forming a plurality of initial germanium-containing fins above a semiconductor substrate, the plurality of initial germanium-containing fins having a same initial axial length and a same initial compressive strain, wherein a first and a second of the initial germanium-containing fins are intended for the formation of at least one P-type FinFET device and at least one N-type FinFET device, respectively, performing at least one etching process so as to cut the first fin to a first axial length and to cut the second fin to a second axial length that is less than the first axial length, wherein the cut first fin retains 65-90% of the initial compressive strain and the cut second fin retains 0-40% of the initial compressive strain, forming at least one first gate structure for the at least one P-type FinFET device around a portion of the cut first fin (at the approximate center of the cut first fin), and forming at least one second gate structure for the at least one N-type FinFET device around a portion of the cut second fin (at the approximate center of the cut second fin).

Yet another illustrative method disclosed herein includes, among other things, forming a plurality of initial silicon fins above a semiconductor substrate, the plurality of initial silicon fins having a same initial axial length and a same initial tensile strain, wherein a first and a second of the initial silicon fins are intended for the formation of at least one N-type FinFET device and at least one P-type FinFET device, respectively, performing at least one etching process so as to cut the first fin to a first axial length and to cut the second fin to a second axial length that is less than the first axial length, wherein the cut first fin retains 65-90% of the initial tensile strain and the cut second fin retains 0-40% of the initial tensile strain, forming at least one first gate structure for the at least one N-type FinFET device around a portion of the cut first fin (at the approximate center of the cut first fin), and forming at least one second gate structure for the at least one P-type FinFET device around a portion of the cut second fin (at the approximate center of the cut second fin).

BRIEF DESCRIPTION OF THE DRAWINGS

The disclosure may be understood by reference to the following description taken in conjunction with the accompanying drawings, in which like reference numerals identify like elements, and in which.

Figure 1:
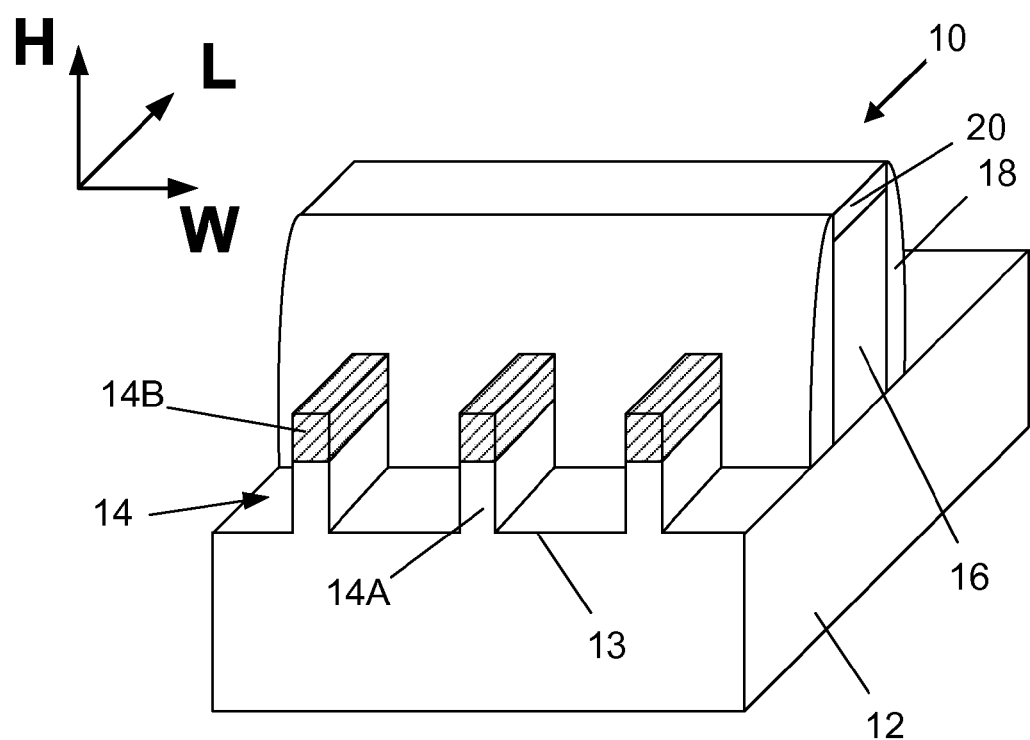
FIG. 1 is a perspective view of one illustrative embodiment of a prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods for modulating strain in PFET and NFET FinFET semiconductor devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

The integrated circuit products 100 depicted herein are formed in and on a semiconducting substrate 102, such as a bulk substrate or an active layer of an SOI type substrate. The substrate 102 may be made of silicon or it may be made of materials other than silicon. Thus, the terms "substrate" or "semiconductor substrate" should be understood to cover all forms of all semiconductor materials. As will be recognized by those skilled in the art after a complete reading of the present application, the illustrative integrated circuit product 100 may be comprised of a plurality of N-type FinFET devices and a plurality of P-type FinFET devices.

As will be appreciated by those skilled in the art after a complete reading of the present application, various doped regions, e.g., source/drain regions, halo implant regions, well regions and the like, for the devices are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

In general, the methods disclosed herein involve formation of initial fins across the entire substrate with either an initial compressive strain or an initial tensile strain (i.e., the strain along what will become the current transport direction of the fins of the FinFET devices) and thereafter cutting some of the initial fins to a desired axial length for one type of device (e.g., a PFET device) while cutting other of the initial fins to a shorter axial length for the other type of device (e.g., an NFET device). In particular, the fins are cut to different lengths such that the longer cut fin will retain at least about 65-90% of the initial strain in the initially formed fins 101, while the shorter cut fin will retain about zero or at most about 40% of the initial strain in the initially formed fins 101. In some cases, the initial fins may be made of a material such as silicon-germanium and they are initially formed with a compressive stress. In other applications, the initial fins may be made of a material such as silicon and they are initially formed with a tensile stress. Of course, gate structures will be formed around the fins (at a location that is the approximate middle of the axial length of the fins) later in the process flow so as to form FinFET devices. Further details and aspects of the various inventions disclosed herein will be described more fully below.

Figure 2A:
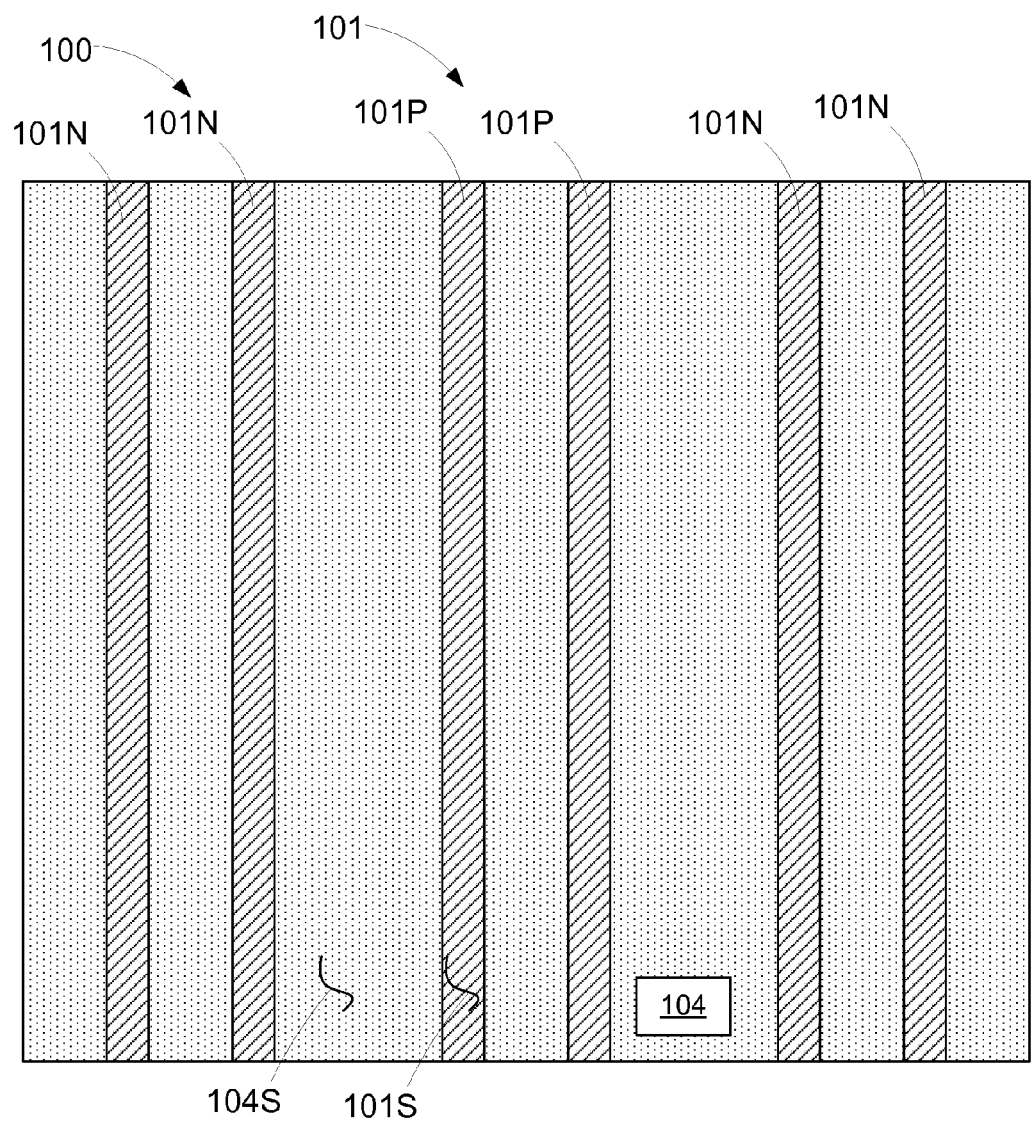
FIGS. 2A-2D are plan views that simplistically depict various illustrative methods disclosed herein for modulating strain in PFET and NFET FinFET semiconductor devices.
Figure 2B:
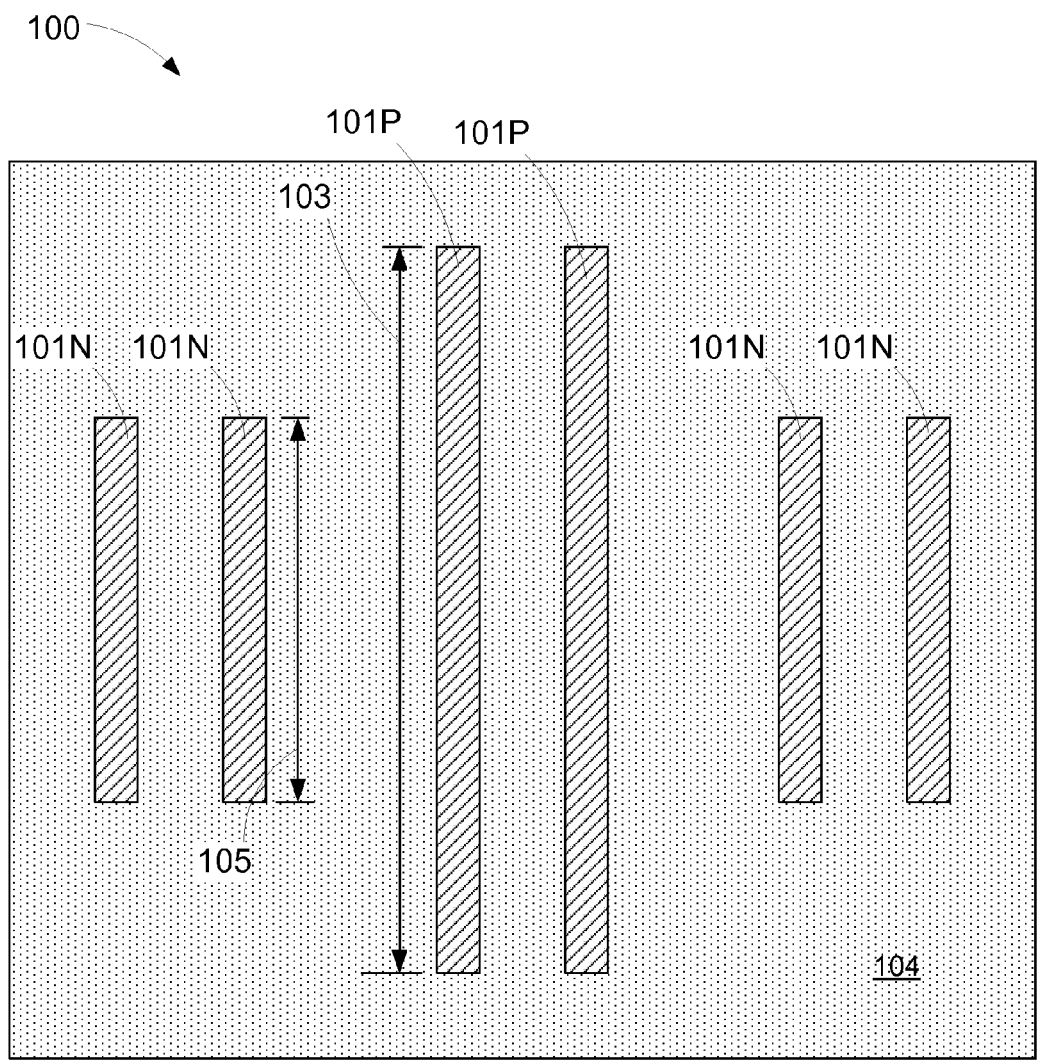

FIGS. 2A-2B are plan views that simplistically depict one illustrative method disclosed herein for modulating strain in PFET and NFET FinFET semiconductor devices having germanium-based channel regions. As shown in FIG. 2A, the product 100 is depicted after a plurality of initial fins 101 have been formed above a substrate 102. The initial fins 101 all have the same initial axial length as they are all uniformly formed above the entire substrate 102. In this example, the initial fins 101 are comprised of a germanium-containing material and they are formed with an initial compressive strain along what will become the current transport direction of the fins of the FinFET devices. Also depicted is a portion of a layer of insulating material 104, e.g., silicon dioxide, that was formed between the germanium-containing fins 101. At this point in the process flow, the upper surface 104S of the layer of insulating material 104 is substantially planar with the upper surface 101S of the initial fins 101. The initial fins 101 may have any desired width and be formed on any desired pitch. In this example, the initial fins 101 are comprised of a plurality of germanium-containing fins 101N that are intended to be used in forming a plurality of N-type FinFET devices, and a plurality of germanium-containing fins 101P that are intended to be used in forming a plurality of P-type FinFET devices. The initial fins 101, as initially formed, have a substantially uniform length and they are made of substantially pure germanium or silicon germanium having a germanium concentration of at least 50%, i.e., $Si_{(x)}Ge_{(1-x)}$, where "x" ranges from 0 to 0.5.

For P-type FinFET devices having a germanium-containing channel material, the performance of such devices is increased if the channel material is compressively strained. N-type FinFET devices can exhibit increased performance when they have a substantially unstrained germanium-containing channel material. The inventors have developed a unique methodology for modulating or controlling the strain in PFET and NFET FinFET semiconductor devices having germanium-based material for the channel region.

With reference to FIG. 2B, one of the methods disclosed herein generally involves forming the initial fins 101 with an initial axial length that is the same for all of the fins 101 and an initial compressive strain that is the same for all of the fins 101. Thereafter, this method involves cutting the germanium-containing initial fins 101 for the P-type and N-type devices to different axial lengths, wherein the fins 101P for the P-type devices are cut such that their axial length 103 is greater than the axial length 105 of the cut fins 101N for the N-type devices. After the fin cutting process is performed, the cut fins 101P for the P-type device retain (along the current transport direction of the cut fins 101P) at least about 65% or, in some cases, about 65-90% of the initial compressive strain in the initial germanium-containing fins 101. In general, the fins 101P and 101N are cut to different axial lengths to insure that about 65-90% the initial compressive strain in the initially formed germanium-containing fins 101 will be substantially maintained in the axially longer fins 101P, while the germanium-containing channel material for the shorter fins 101N will be substantially relaxed, i.e., the cut fins 101N will have substantially zero of the initial strain or retain at most about 40% of the initial compressive strain that was present in the initial germanium-containing fins 101 when they were formed. That is, the shorter of the cut fins is cut to a length such that it retains significantly less (e.g., at least about 25% less) of the initial compressive strain on the initial fins than does the longer of the cut fins. The magnitude of the compressive strain in the initial germanium-containing fins 101 may vary depending upon the particular application. In one illustrative embodiment, the initial compressive strain in the initial germanium-containing fins 101 may be about −1 to −4 GPa. Additionally, the initial germanium-containing fins 101 may be initially formed in a fully strained condition. As used herein and in the attached claims, when it is stated that the initial fin 101 or the cut fins have or retain a "strain," it is referring to the strain along the current transport direction of the initial fins or the cut fins, as the case may be.

FIG. 2B depicts one illustrative example after the fins 101P and 101N were cut to different axial lengths 103, 105, respectively. The fins 101 were cut using a patterned etch mask (not shown, i.e., a so-called "fin cut" mask), and the locations where the fins 101 were removed was subsequently re-filled with more of the insulating material 104, and a CMP process was performed to planarize the materials relative to the upper surface 101S of the fins 101. In the illustrative example depicted herein, the cut fins 101 depicted in FIG. 2B have cut lengths 103, 105 that are for single FinFET devices, however, this process may, of course, be extended to fabricate additional N-type and P-type FinFET devices above the substrate 102. Gate structures (not shown in FIG. 2B) for each of the P and N type devices will eventually be formed around the fins at approximately the middle of the axial length of the fins. In general, the absolute value of the lengths 103, 105 may vary depending upon the particular application, the material selected for the germanium-containing fins 101 and the initial strain induced in the germanium-containing fins 101 as initially formed. In one example, the axial length 103 of the cut fins 101P may be about three times the axial length 105 of the cut fins 101N. As another example, the axial length 103 of the fins 101P may be about 300-1000 nm, while the axial length 105 of the fins 101N may be about 50-250 nm. In one particularly illustrative embodiment, where the germanium-containing fins 101 are made of $SiGe_{0.50}$, the length 103 may be about 300 nm or more and the length 105 may be about 250 nm or less.

Figure 2C:
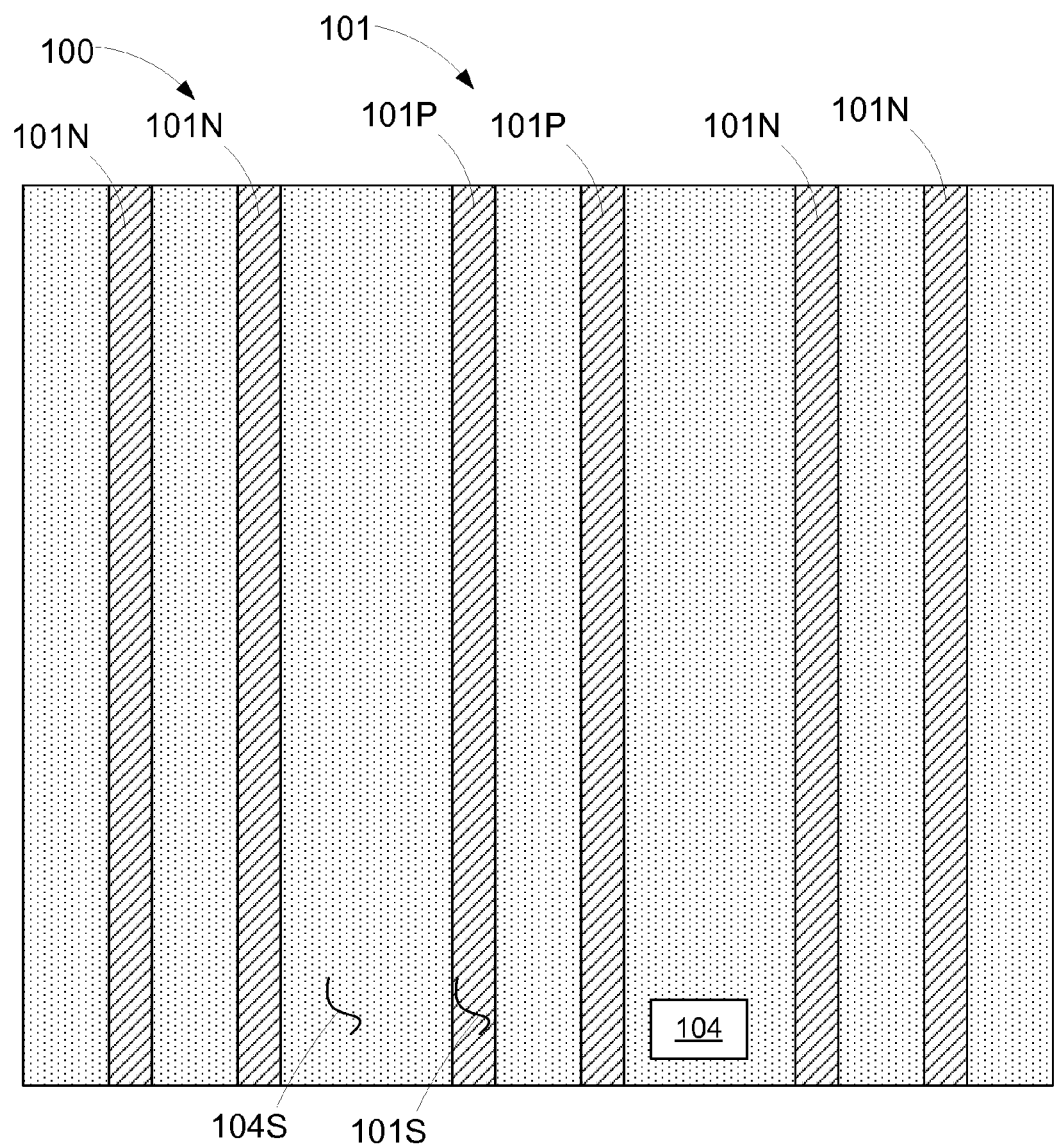
Figure 2D:
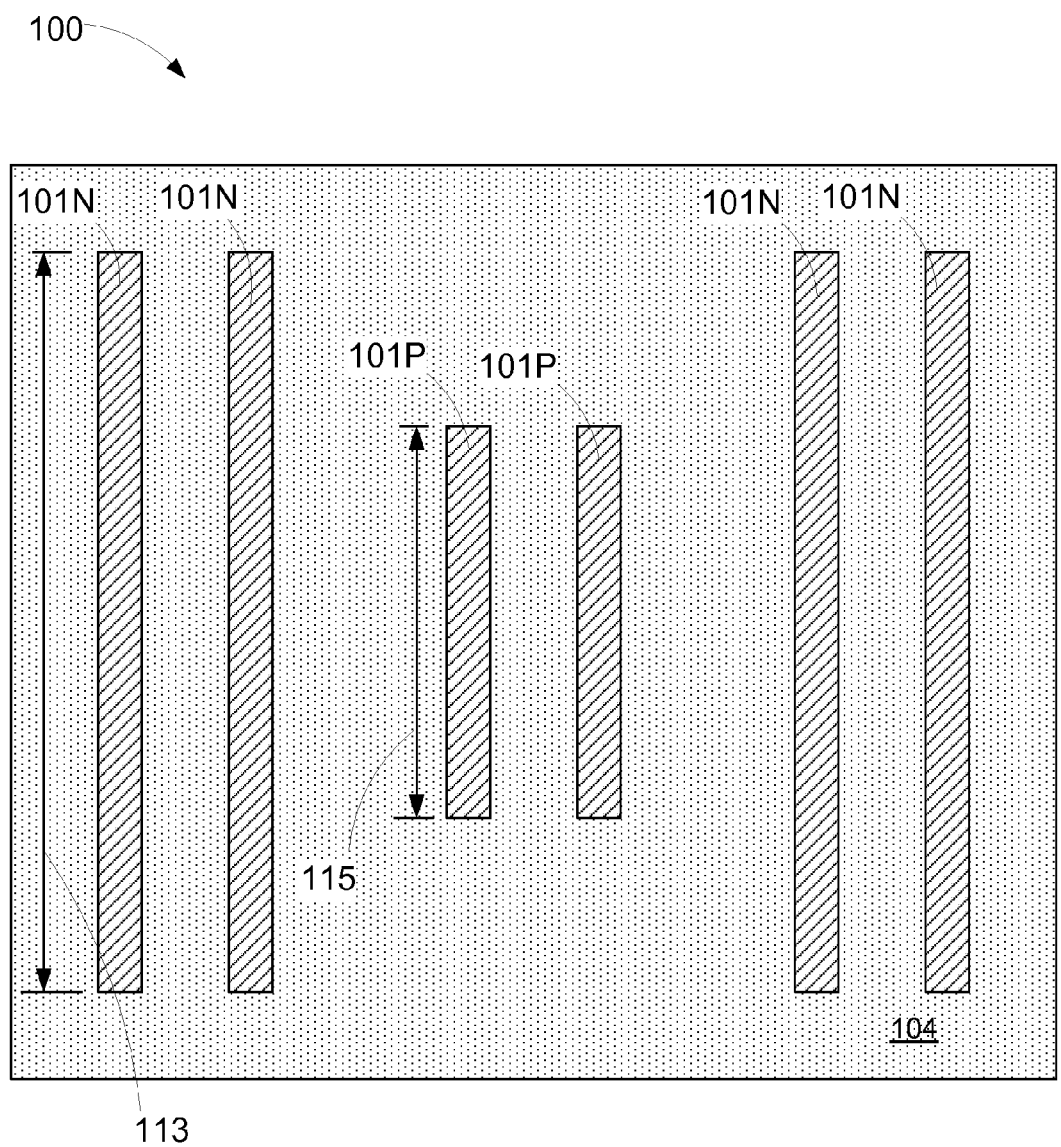

FIGS. 2C-2D are plan views that simplistically depict yet another illustrative method disclosed herein for modulating strain in PFET and NFET FinFET semiconductor devices. As before, as shown in FIG. 2C, the product 100 is depicted after a plurality of initial fins 101 have been formed above the substrate 102. As before, the initial fins 101 all have the same initial axial length as they are all uniformly formed above the entire substrate 102. However, in this example, the initial fins 101 are made of silicon and they are formed with an initial tensile strain along what will become the current transport direction of the fins of the FinFET devices. The above-described layer of insulating material 104 is also depicted. As before, at this point in the process, the upper surface 104S of the layer of insulating material 104 is substantially planar with the upper surface 101S of the initial fins 101. In this example, the initial fins 101 are comprised of a plurality of fins 101N that are intended to be used in forming a plurality of N-type FinFET devices, and a plurality of fins 101P that are intended to be used in forming a plurality of P-type FinFET devices. The initial fins 101, as initially formed, have a substantially uniform length and they are made of silicon.

With continuing reference to FIGS. 2C-2D, one of the methods disclosed herein generally involves forming the initial fins 101 with an initial axial length that is the same for all of the fins 101 and an initial tensile strain that is the same for all of the initial fins 101. Thereafter, this particular example involves cutting the initial fins 101 for the P-type and N-type devices to different axial lengths, wherein the fins 101N for the N-type devices are cut such that their axial length 113 is greater than the axial length 115 of the cut fins 101P for the P-type devices. After the fin cutting process is performed, the cut fins 101N for the N-type device retain (along the current transport direction of the cut fins 101N) at least about 65-90% percent of the initial tensile strain in the initial fins 101. In general, the fins 101P and 101N are cut to different axial lengths to insure that at least 65-90% of the initial tensile strain in the initially formed fins 101 will be substantially maintained in the axially longer fins 101N, while the shorter fins 101P will be substantially relaxed, i.e., the cut fins 101P will have substantially zero or retain at most about 40% (along the current transport direction of the cut fins 101P) of the initial tensile strain that was present in the initial fins 101 when they were formed, i.e., the shorter of the cut fins is cut to a length such that it retains significantly less (e.g., at least about 25% less) of the initial tensile strain on the initial fins than does the longer of the cut fins. The magnitude of the tensile strain in the initial fins 101 may vary depending upon the particular application. In one illustrative embodiment, the initial tensile strain in the initial fins 101 may be about +0.8-+3 GPa. As before, the initial fins 101 may be initially formed in a fully strained condition.

FIG. 2D depicts one illustrative example after the fins 101N and 101P were cut to different axial lengths 113, 115, respectively. As before, the fins 101 were cut using a patterned etch mask (not shown, i.e., a so-called "fin cut" mask), and the locations where the fins 101 were removed was subsequently re-filled with more of the insulating material 104, and a CMP process was performed to planarize the materials relative to the upper surface 101S of the fins 101. As before, the cut fins 101N, 101P depicted in FIG. 2D have cut lengths that are for single FinFET devices, and the gate structures are not depicted. In general, the absolute value of the lengths 113, 115 may vary depending upon the particular application, the material selected for the fins 101 and the initial strain induced in the fins 101 as initially formed. In one example, the axial length 113 of the cut fins 101N may be about three times the axial length 115 of the cut fins 101P. As another example, the axial length 113 of the fins 101N may be about 300-1000 nm, while the axial length 115 of the fins 101P may be about 50-250 nm. In one particularly illustrative embodiment, where the fins 101 are made of silicon, the length 113 may be about 300 nm or more and the length 115 may be about 250 nm or less.

Figure 3A:
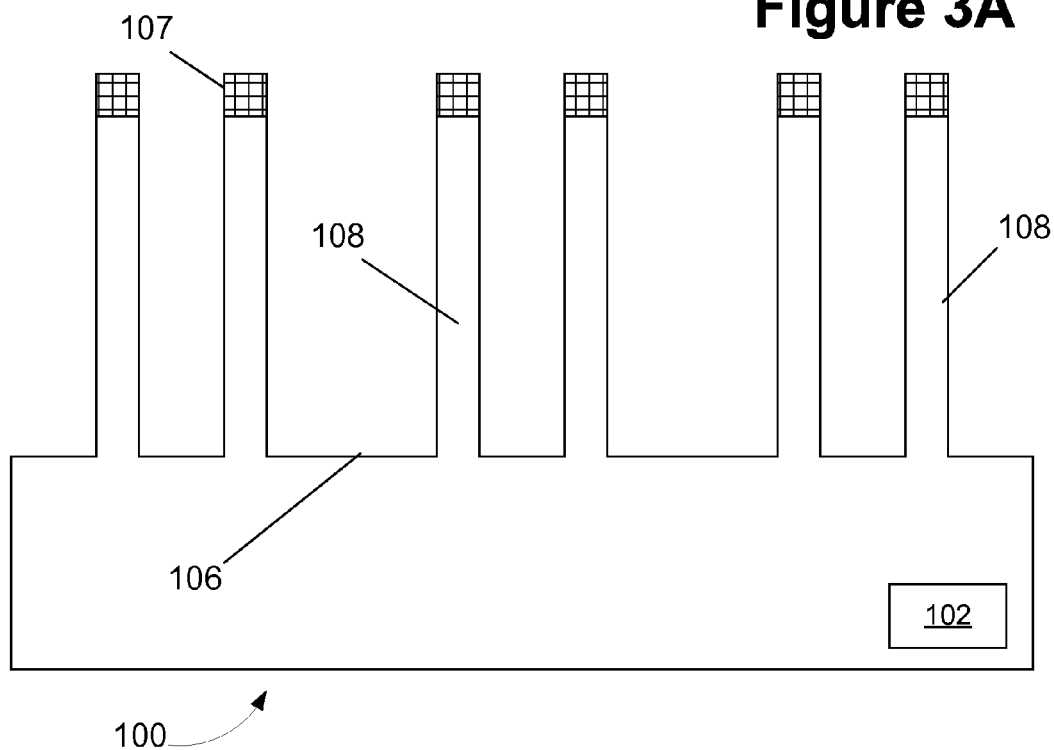
FIGS. 3A-3P depict various illustrative methods disclosed herein for modulating strain in PFET and NFET germanium FinFET semiconductor devices.
Figure 3B:
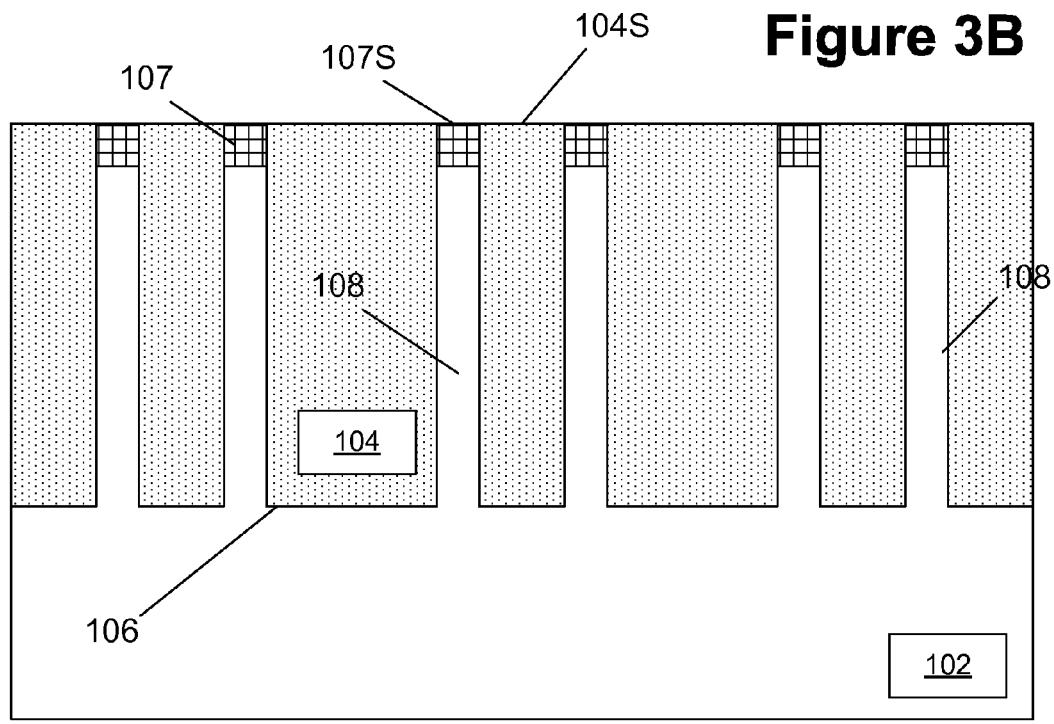
Figure 3C:
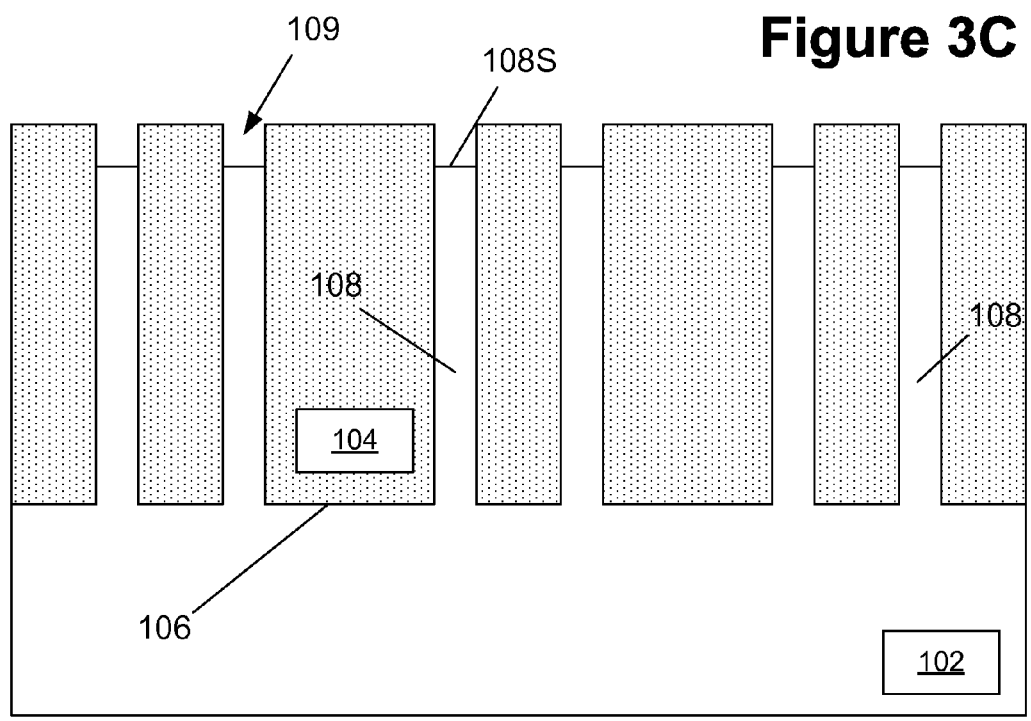
Figure 3D:
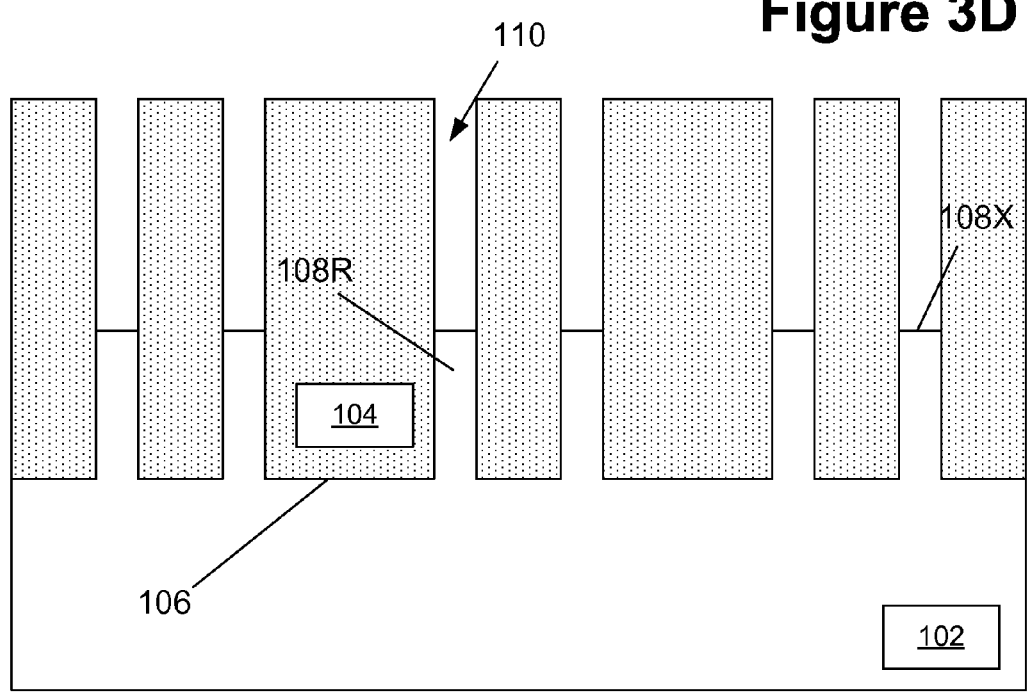
Figure 3E:
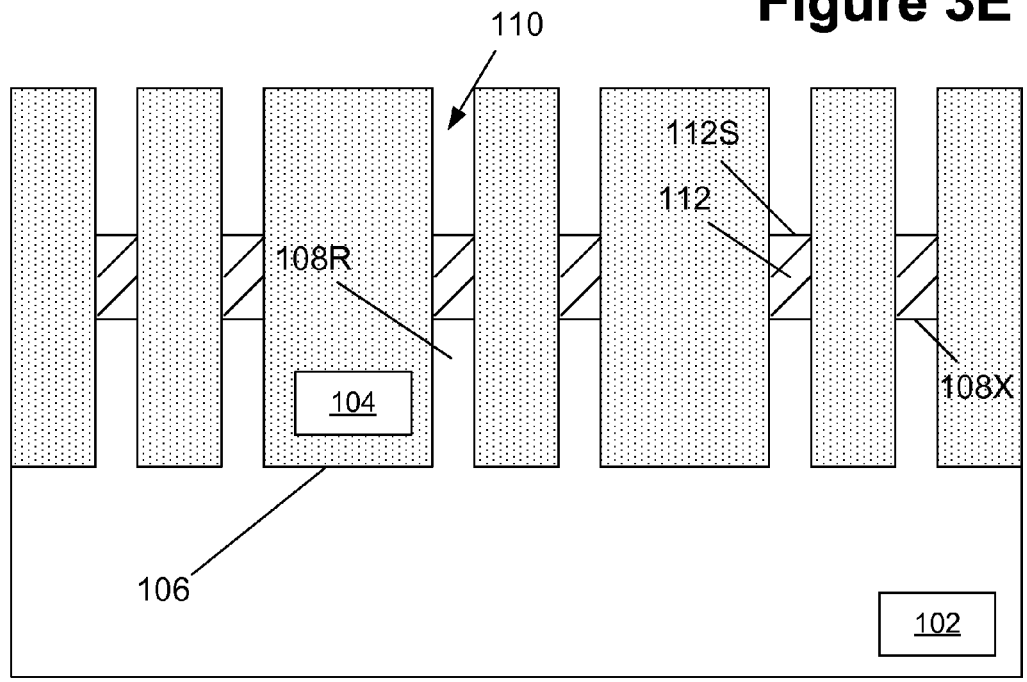
Figure 3F:
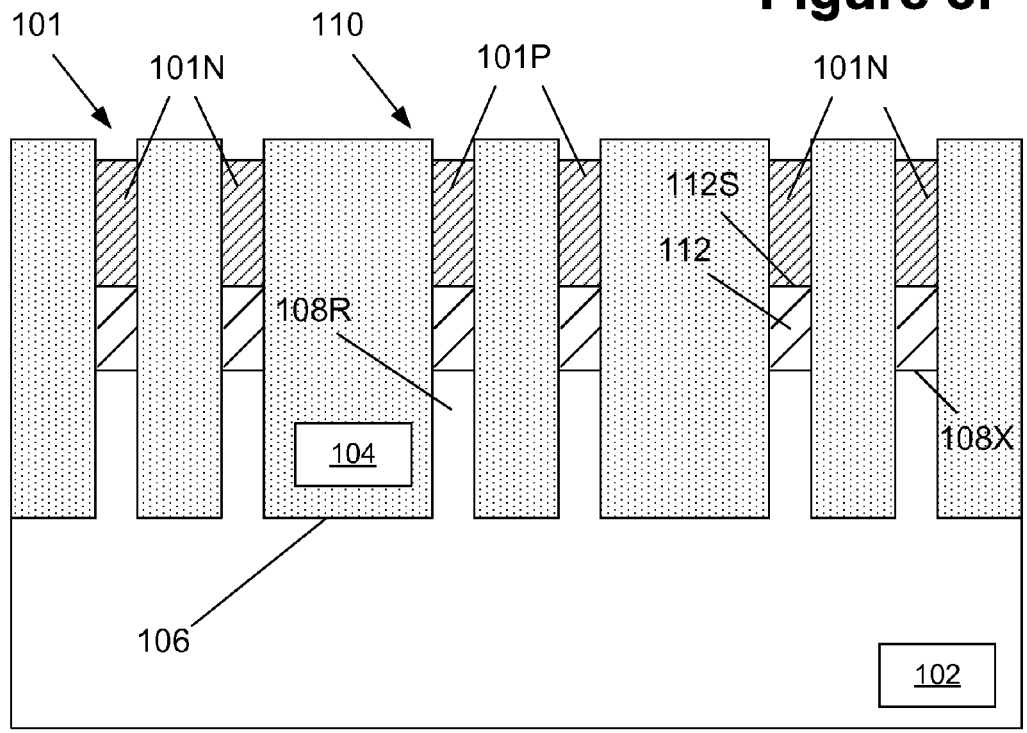
Figure 3G:
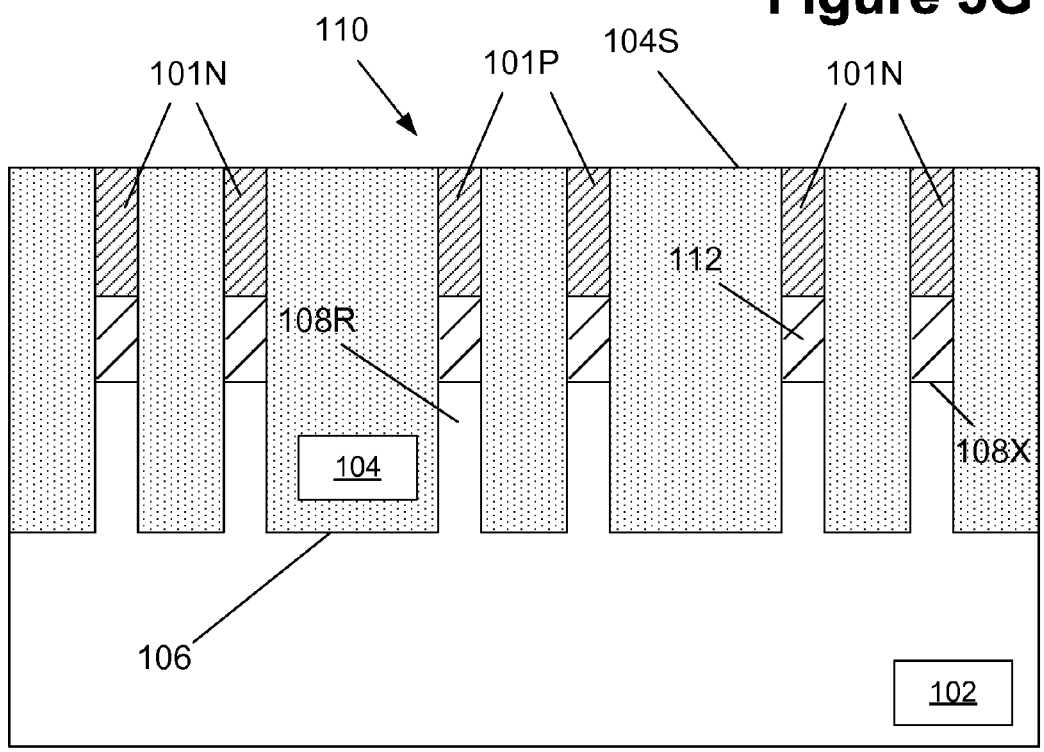
Figure 3H:
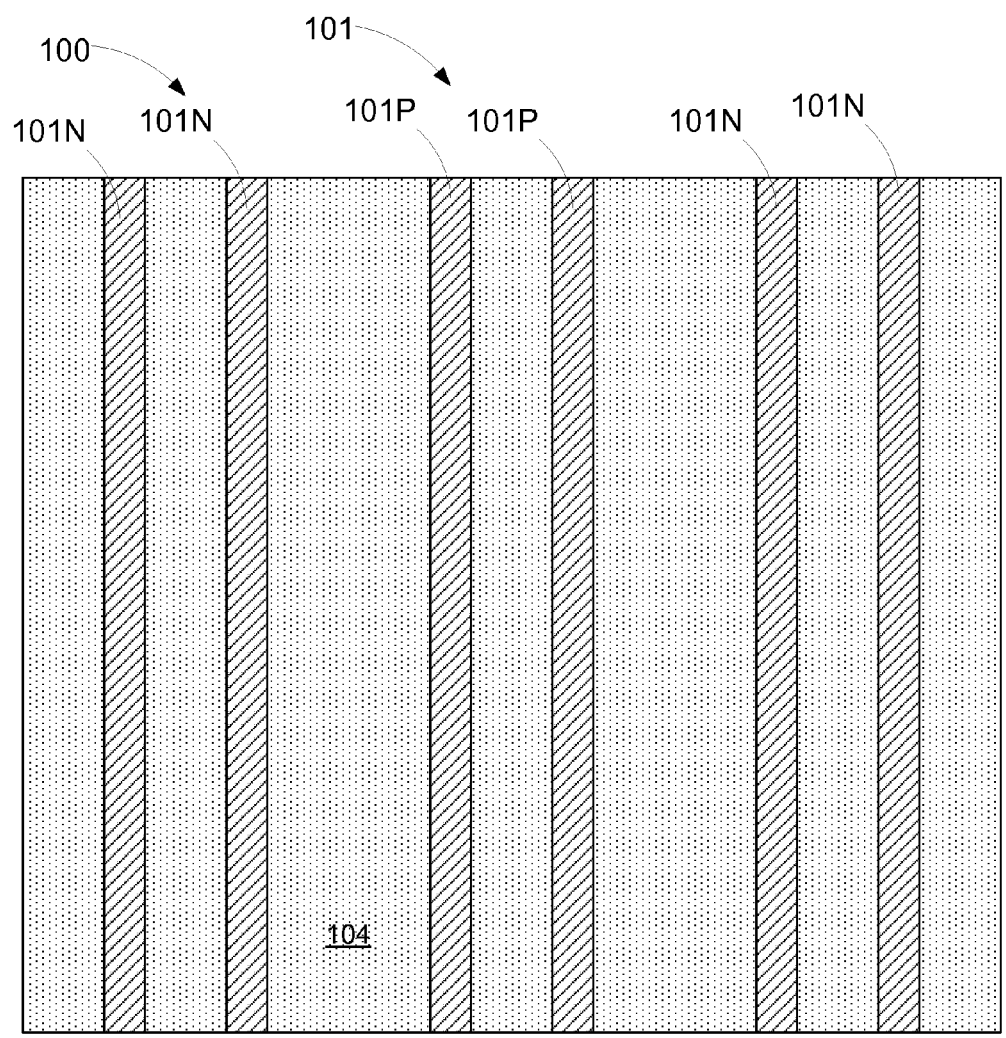
Figure 3I:
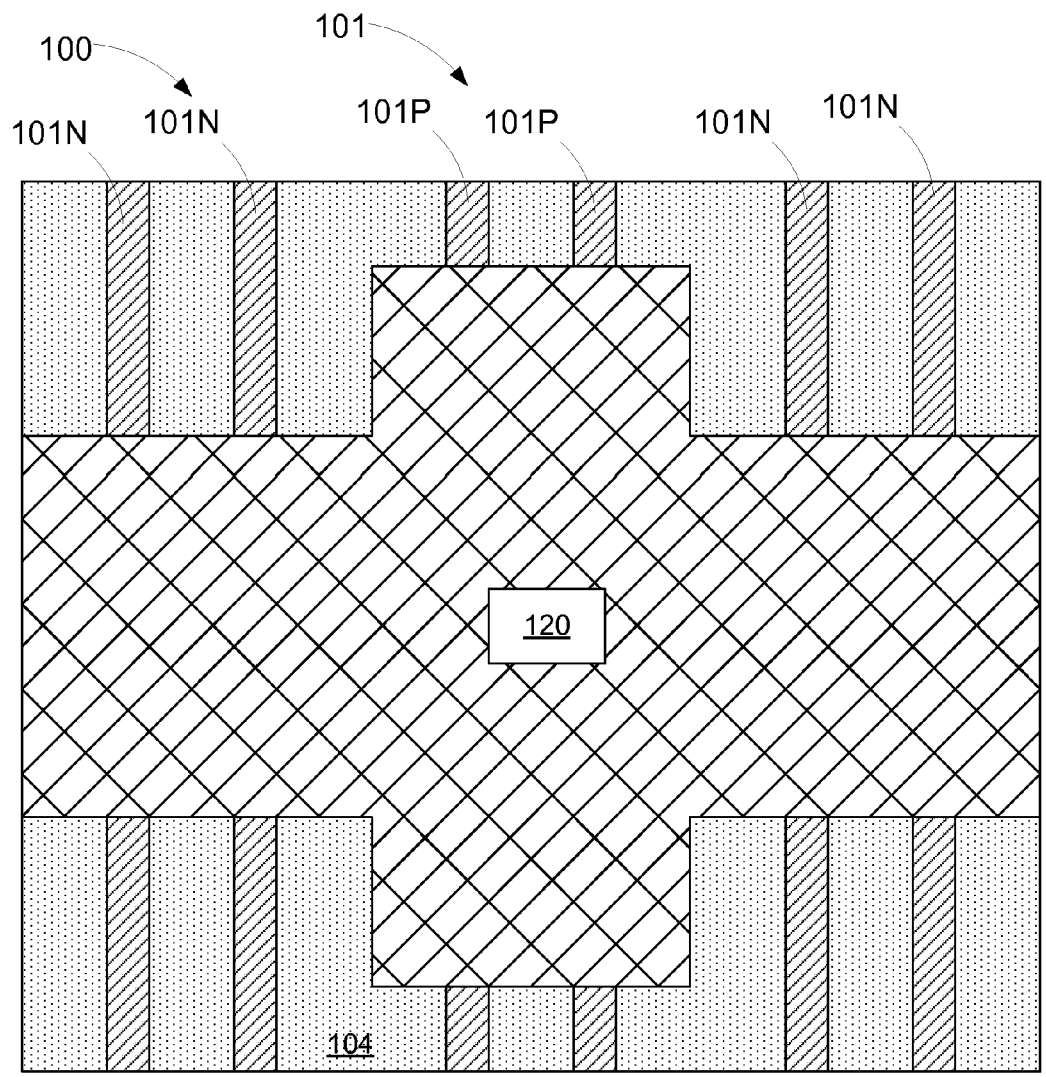
Figure 3J:
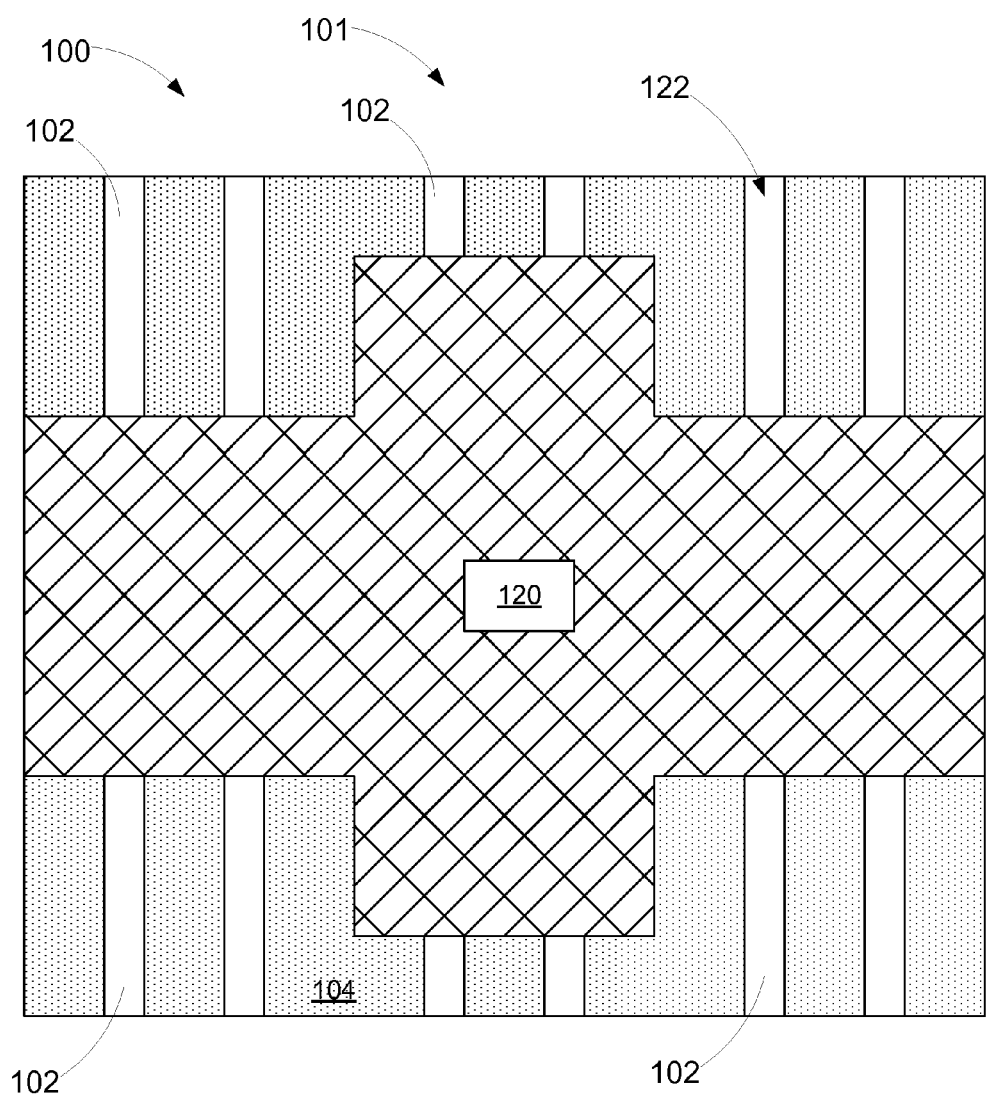
Figure 3K:
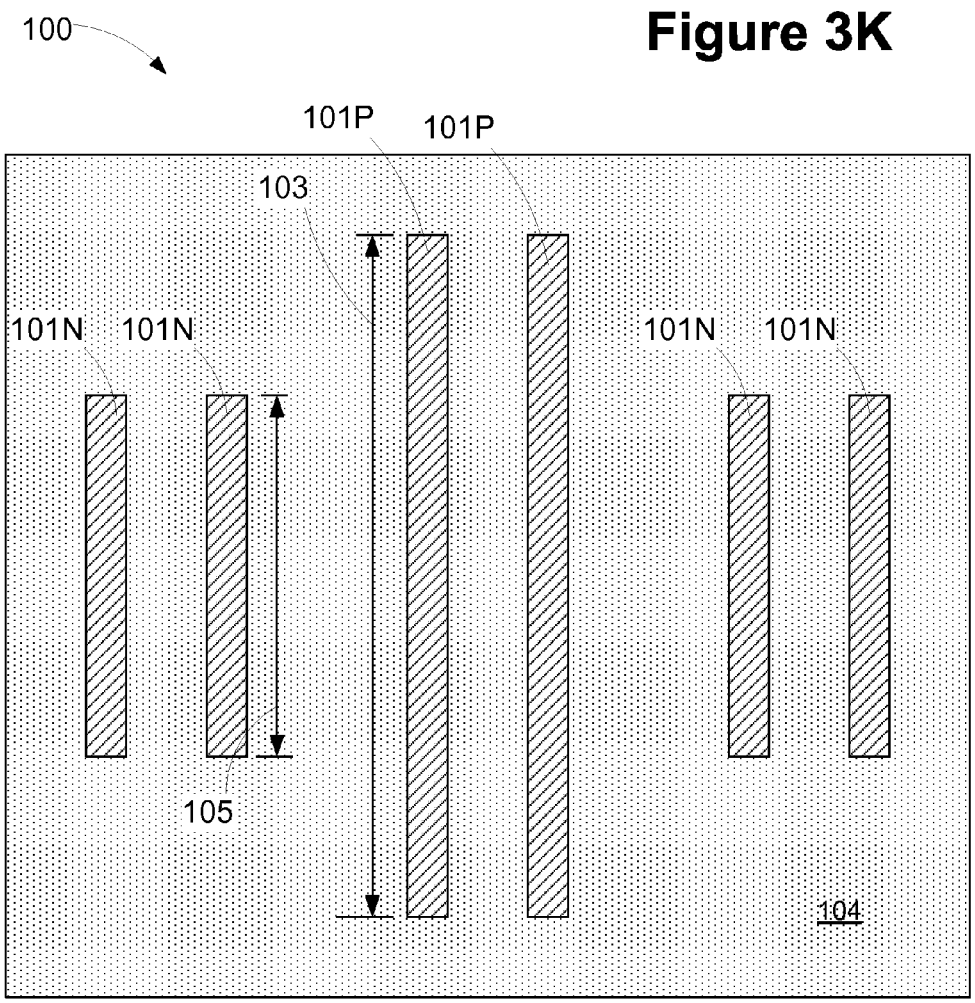
Figure 3L:
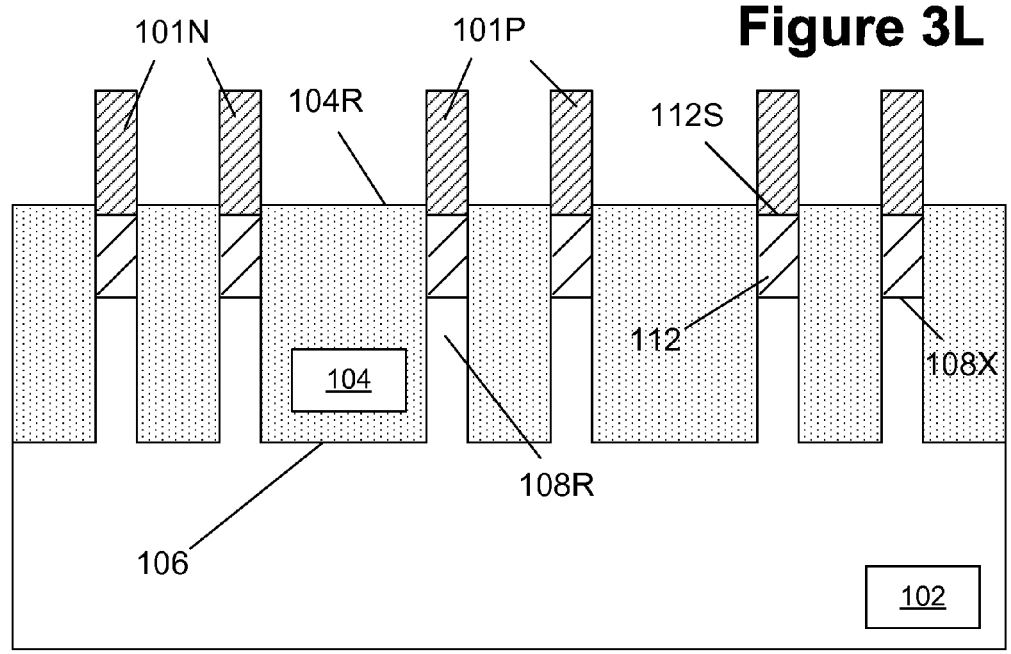
Figure 3M:
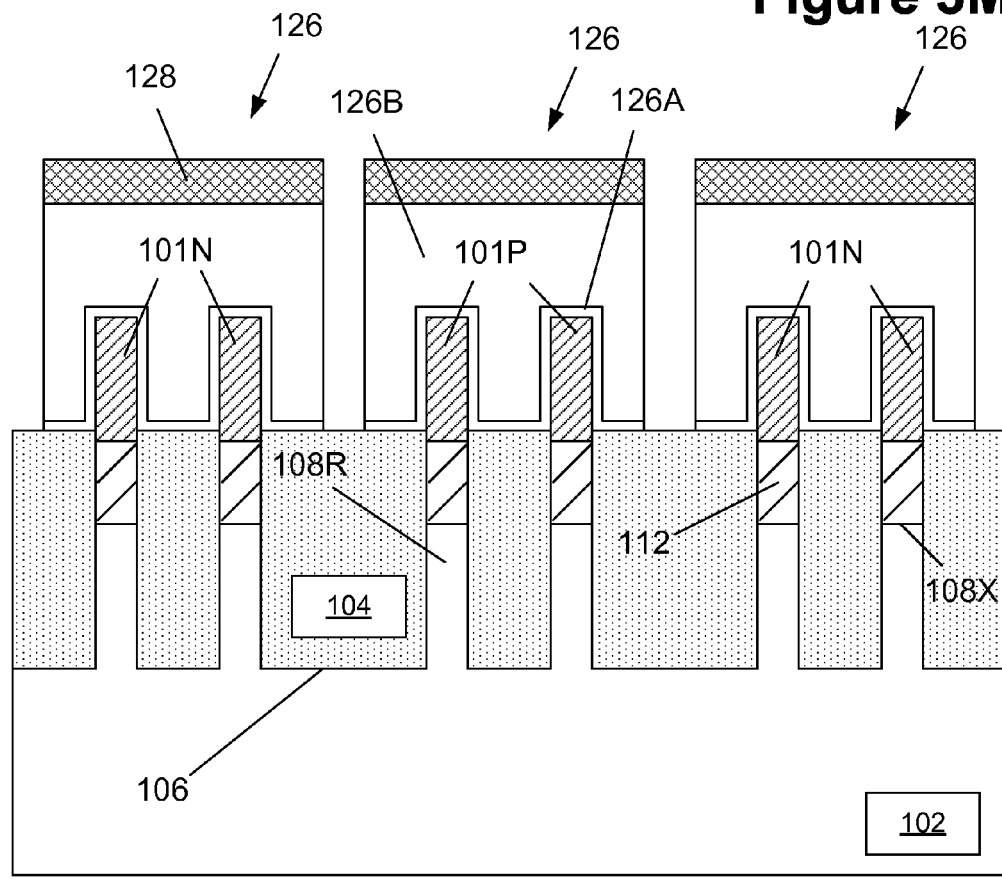
Figure 3N:
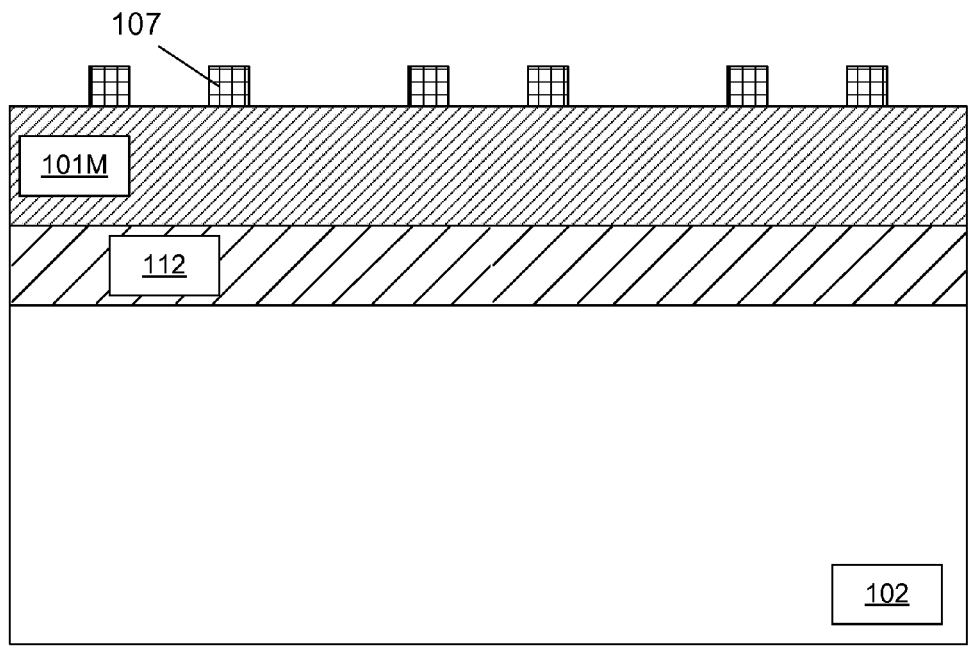
Figure 3O:
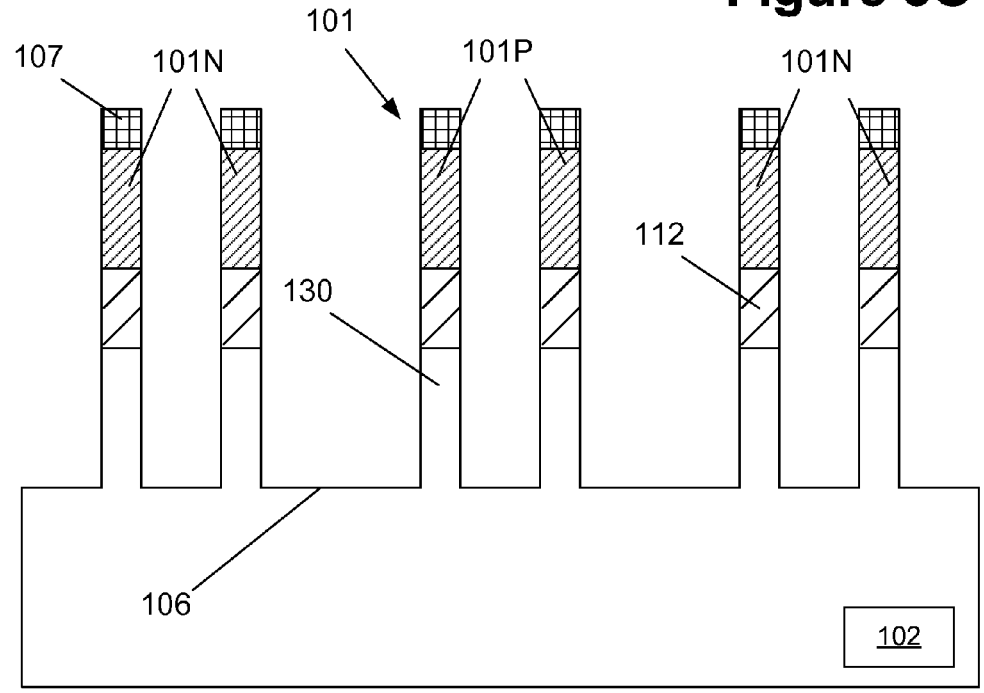
Figure 3P:
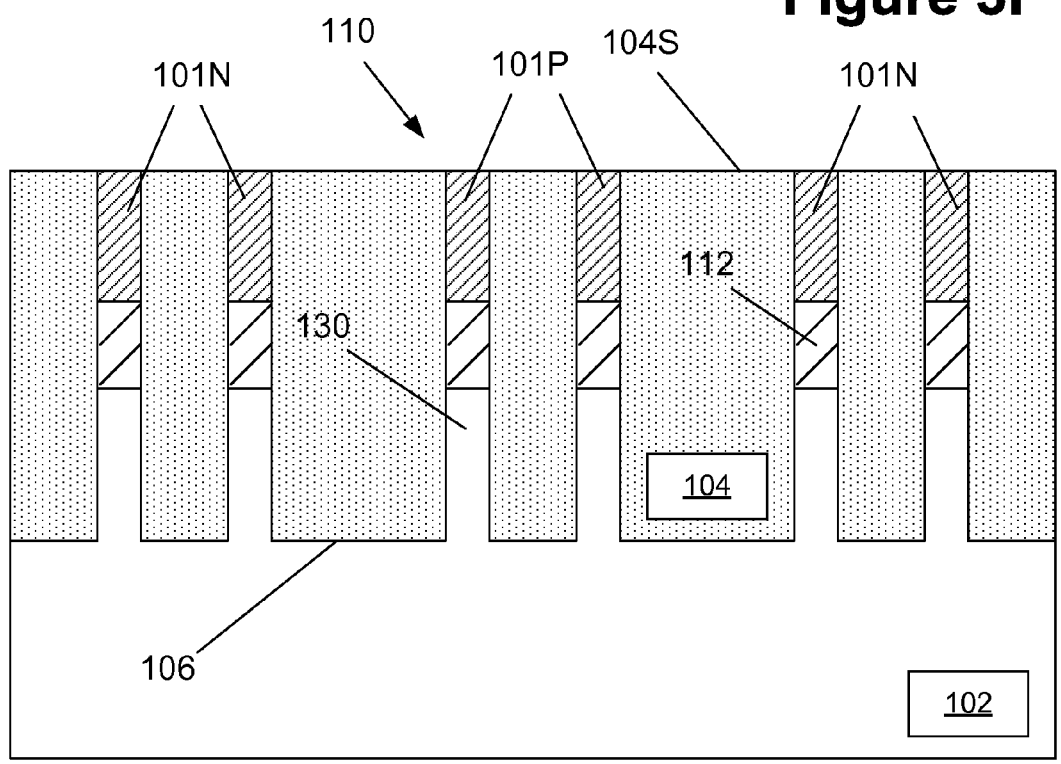

FIGS. 3A-3P depict various illustrative methods disclosed herein for modulating strain in PFET and NFET germanium FinFET semiconductor devices. At the point of fabrication depicted in FIG. 3A, a patterned mask layer 107, such as a patterned hard mask layer, has been formed above the substrate 102 using known photolithography and etching techniques. The patterned mask layer 107 is intended to be representative in nature as it could be comprised of a variety of materials, such as, for example, a photoresist material, silicon nitride, silicon oxynitride, silicon dioxide, etc. Moreover, the patterned mask layer 107 could be comprised of multiple layers of material, such as, for example, a pad oxide layer (not separately shown) that is formed on the substrate 102 and a pad silicon nitride layer (not separately shown) that is formed on the pad oxide layer. Thus, the particular form and composition of the patterned mask layer 107 and the manner in which it is made should not be considered a limitation of the presently disclosed inventions.

With continuing reference to FIG. 3A, an etching process, such as a dry or wet etching process, was performed on the substrate 102 through the patterned mask layer 107 to form a plurality of fin-formation trenches 106. This etching process results in the definition of a plurality of substrate fins 108. The overall size, shape and configuration of the fin-formation trenches 106 and substrate fins 108 may vary depending on the particular application. The depth and width of the fin-formation trenches 106 may vary depending upon the particular application. In one illustrative embodiment, based on current-day technology, the depth of the fin-formation trenches 106 may range from approximately 30-150 nm and the width of the fin-formation trenches 106 may range from about 20-50 nm. In some embodiments, the substrate fins 108 may have a final width within the range of about 5-30 nm. In the illustrative example depicted herein, the fin-formation trenches 106 and substrate fins 108 are all of a uniform size and shape. However, as discussed more fully below, such uniformity in the size and shape of the fin-formation trenches 106 and the substrate fins 108 is not required to practice at least some aspects of the inventions disclosed herein. In the example depicted herein, the fin-formation trenches 106 are formed by performing an anisotropic etching process that results in the fin-formation trenches 106 having a schematically depicted, generally rectangular configuration. In an actual real-world device, the sidewalls of the fin-formation trenches 106 may be somewhat inwardly tapered, although that configuration is not depicted in the drawings. In some cases, the fin-formation trenches 106 may have a reentrant profile near the bottom of the fin-formation trenches 106. To the extent the fin-formation trenches 106 are formed by performing a wet etching process, the trenches 106 may tend to have a more rounded configuration or non-linear configuration as compared to the generally rectangular configuration of the trenches 106 that are formed by performing an anisotropic etching process. Thus, the size and configuration of the trenches 106, and the manner in which they are made, should not be considered a limitation of the present invention. For ease of disclosure, only the substantially rectangular fin-formation trenches 106 will be depicted in subsequent drawings.

FIG. 3B depicts the product 100 after several process operations were performed. First, the layer of insulating material 104 was formed so as to over-fill the trenches 106. Thereafter, one or more chemical mechanical polishing (CMP) processes were performed to planarize the surface 104S using the patterned mask layer 107 as a polish-stop layer. After such a CMP process, the surface 104S of the layer of insulating material 104 is substantially level with the surface 107S of the mask layer 107. The layer of insulating material 104 may be comprised of a variety of different materials, such as silicon dioxide, a flowable oxide, etc., and it may be formed by performing a variety of techniques, e.g., CVD, spin-coating, etc.

Next, as shown in FIG. 3C, an etching process was performed to remove the patterned hard mask layer 107. The etching process results in the definition of cavities 109 that expose the upper surfaces 108S of the substrate fins 108.

Then, as shown in FIG. 3D, an etching process was performed to recess the substrate fins 108 to thereby define recessed substrate fins 108R having a recessed upper surface 108X. The magnitude of the recessing of the original substrate fins 108 may vary depending on the particular application. This process operation results in the formation of a plurality of recessed fin cavities 110.

FIG. 3E depicts the product 100 after a strain relaxed buffer (SRB) layer 112 was formed in the recessed fin cavities 110 on the upper surface 108X of the recessed substrate fins 108R. The overall thickness (or height) of the SRB layer 112 may vary depending upon the particular application, e.g., 5-100 nm. The SRB layer 112 may be formed by using well-known aspect ratio trapping (ART) techniques wherein an epitaxial growth process is performed to form the SRB material to such a thickness that it is in a substantially relaxed condition. The SRB layer 112 may be comprised of a variety of materials, such as relaxed silicon-germanium with a germanium concentration of between about 20-60%, etc.

FIG. 3F depicts the product after the initial fins 101 were formed in the cavities 110 on the upper surface 112S of the SRB layer 112. All of the initial fins 101 are formed to the same axial length. All of the initial fins 101 are formed with an initial strain along what will become the current transport direction of the fins of the FinFET devices, e.g., a compressive strain or tensile strain depending upon the particular applications. As depicted, some of the initial fins 101 are fins 101N that are intended for N-type devices, while other of the initial fins 101 are fins 101P that are intended for P-type devices. The initial fins 101 may be formed from a variety of materials, e.g., silicon-germanium or silicon, and they may be formed by performing an epitaxial growth process so as to exhibit the desired compressive or tensile strain (depending upon the particular application). The overall thickness (or height) of the initial fins 101 may vary depending upon the particular application, e.g., 20-200 nm. The magnitude of the compressive strain or the tensile strain in the initial fins 101 may be as noted above. In one embodiment, the initial fins 101 may be initially formed in a fully strained condition. The techniques employed to form the initial fins 101 with the desired compressive strain or tensile strain are well known to those skilled in the art. As noted above, the initial fins 101 may be made of substantially pure silicon, substantially pure germanium or silicon germanium having a germanium concentration of at least 10%.

FIG. 3G depicts the product after one or more chemical mechanical polishing (CMP) processes were performed to planarize the surface 104S. After such a CMP process, the surface 104S of the layer of insulating material 104 is substantially level with the upper surfaces of the initial fins 101. FIG. 3H is a plan view of the product 100 that corresponds to the cross-sectional view depicted in FIG. 3G. Note that FIG. 3H also corresponds to FIGS. 2A and 2C.

After formation of the initial fins 101, the initial fins 101 for the N and P type devices must be cut to their desired axial lengths. FIG. 3I depicts the illustrative example wherein the initial fins 101 are formed with a compressive strain, and wherein the fins for the P-type device will be cut so as to have a greater axial length than the axial length of the fins for the N-type devices. Accordingly, FIG. 3I depicts the product after a patterned etch mask 120, (e.g., a fin-cut-mask) was formed above the initial fins 101 and the layer of insulating material 104. In one embodiment, the patterned etch mask 120 may be comprised of a patterned layer of photoresist or a patterned hard mask layer. In this example, the patterned etch mask 120 covers the portions of the fins 101N and 101P that are to be saved and used to form the N and P type FinFET devices. The portions of the initial fins 101 not covered by the patterned etch mask 120 will be removed.

FIG. 3J depicts the product 100 after an etching (wet or dry) process was performed through the patterned masking layer 120 to remove the exposed portions of the initial fins 101 and the underlying SRB layer 112 selectively relative to the layer of insulating material 104 and the substrate 102. This process operation results in the formation of a plurality of removed fin cavities 122.

FIG. 3K depicts the product after several process operations were performed. First, the patterned etch mask 120 was removed. Thereafter, additional insulating material 104 was deposited so as to over-fill the removed fin cavities 122. Next, a planarization process, e.g., a CMP process, was performed to planarize the additional insulating material 104 with the upper surface of the now-cut fins 101N, 101P and the original insulating material 104. The above-described process operations results in the formation of cut fins 101P for the P-type devices that have a longer axial length 103 than the axial length 105 of the cut fins 101N for the N-type devices. Note that FIG. 3K also corresponds to FIG. 2B. The strain condition of the cut fins 101P and the cut fins 101N may be as noted above. Of course, the initial fins 101 may be formed with a tensile stress and cut as described above with respect to FIGS. 2C-2D.

At this point in the process flow, traditional manufacturing techniques may be performed to complete the fabrication of the FinFET devices for the product 100. Accordingly, FIG. 3L depicts the product 100 after an etching process was performed on the layer of insulating material 104 to reduce its thickness and thereby result in the layer of insulating material 104 having a recessed surface 104R that exposes the final fin height of the cut fins 101P, 101N. The final fin height may vary depending upon the particular application and, in one illustrative embodiment, may range from about 5-50 nm. In one illustrative example, the recessed surface 104R of the layer of insulating material 104 is positioned at a level that is above that of the upper surface 112S of the SRB layer 112, i.e., the recessing of the layer of insulating material 104 is controlled such that only the cut fins 101P, 101N are exposed above the recessed surface 104R of the layer of insulating material 104. In other applications, the layer of insulating material 104 may be recessed by an amount such that the entirety of the cut fins 101P, 101N and a portion of the underlying SRB material 112 are positioned above the recessed surface 104R of the layer of insulating material 104.

FIG. 3M depicts the devices after illustrative gate structures 126 were formed for the N and P type FinFET devices. In one illustrative embodiment, the schematically depicted gate structures 126 include an illustrative gate insulation layer 126A and an illustrative gate electrode 126B. The gate insulation layer 126A may be comprised of a variety of different materials, such as, for example, silicon dioxide, a so-called high-k (k greater than 10) insulation material (where k is the relative dielectric constant), etc. Similarly, the gate electrode 126B may also be of a material such as polysilicon or amorphous silicon, or it may be comprised of one or more metal layers that act as the gate electrode 126B. As will be recognized by those skilled in the art after a complete reading of the present application, the gate structures of the FinFET devices depicted in the drawings, i.e., the gate insulation layer 126A and the gate electrode 126B, are intended to be representative in nature. That is, the gate structures 126 may be comprised of a variety of different materials and they may have a variety of configurations, and the gate structures 126 may be sacrificial gate structures or final gate structures, i.e., the gate structures of the FinFET devices disclosed herein may be made using either the so-called "gate-first" or "replacement gate" techniques. Of course, the materials of construction for the final gate structures for the N and P type devices may be different. In one illustrative embodiment, as shown in FIG. 3M, a conformal deposition process may be performed to form a gate insulation layer 126A comprised of a material such as, for example, hafnium oxide, a high-k (k value greater than 10) insulating material, etc., on the germanium-containing fins 101. Also depicted in FIG. 3M is an illustrative gate cap layer 128 (e.g., silicon nitride) for each of the gate structures 126.

FIGS. 3N-3P depict an alternative technique for forming the initial fins 101. In this embodiment, with reference to FIG. 3N, the above-described SRB layer 112 is formed on the substrate 102 so as to form what is sometimes referred to as a "virtual" substrate within the industry. Next, a layer of fin material 101M is formed on the SRB layer 112. The fin material 101M will be used to make the initial fins 101 described above, thus its composition and characteristics may be the same as those described above for the initial fins 101. That is, in some cases, the fin material 101M may be formed so as to exhibit a compressive strain, while in other applications it may be formed so as to exhibit a tensile strain. Also depicted in FIG. 3N is the above-described patterned hard mask layer 107 that was formed above the fin material layer 101M.

FIG. 3O depicts the product after one or more etching processes, such as a dry or wet etching process, were performed through the patterned mask layer 107 on the fin material layer 101M, the SRB layer 112 and the substrate 102 so as to form a plurality of fin-formation trenches 106. This etching process results in the definition of a plurality of substrate fins 130, a portion of SRB material 112 positioned thereabove and the initial fins 101 positioned above the SRB material. As before, the size and configuration of the trenches 106, and the manner in which they are made, should not be considered a limitation of the present invention.

FIG. 3P depicts the product 100 after several process operations were performed. First, the layer of insulating material 104 was formed so as to over-fill the trenches 106. Thereafter, one or more chemical mechanical polishing (CMP) processes were performed to planarize the surface 104S with the upper surfaces of the initial fins 101. These CMP processes result in the removal of any remaining portions of the patterned mask layer 107. Note that the structure depicted in FIG. 3P corresponds to the structure depicted in FIGS. 3G-3H. At this point, the process operations described above with respect to FIGS. 3I-3M may be performed to complete the fabrication of the FinFET devices. Using the methods disclosed in FIGS. 3N-3P, the fin recessing steps in the previous example may be omitted as the SRB layer 112 and the fin material layer 101M are formed prior to performing the etching processes to define the fin-formation trenches 106.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of fin-formation trenches in a substrate to define a plurality of substrate fins:
    over-filling said plurality of fin-formation trenches with an insulting material;
    performing a recess etching process on said plurality of substrate fins to remove portions of said substrate fins and thereby define a plurality of recessed substrate fins and a fin cavity above each of said recessed substrate fins that is bounded by said insulting material;
    forming a strain relaxed buffer material in each of said fin cavities on said recessed substrate fins; and
    forming a plurality of initial fins in each of said fin cavities on said strain relaxed buffer material, said plurality of initial fins having a same initial axial length and a same initial strain along a current transport direction of said plurality of initial fins;
    performing at least one etching process so as to cut a first fin to a first axial length and to cut a second fin to a second axial length that is less than said first axial length, wherein said cut first fin retains a first amount of said initial strain and said cut second fin retains zero of said initial strain or a second amount of said initial strain, said second amount being less than said first amount;
    forming a first gate structure for a first FinFET device around a portion of said cut first fin; and
    forming a second gate structure for a second FinFET device around a portion of said cut second fin.

2. The method of claim 1 wherein said plurality of initial fins are comprised of silicon-germanium with a germanium concentration of at least 50%, said initial strain is a compressive strain, said first FinFET device is a P-type FinFET device and said second FinFET device is an N-type FinFET device.

3. The method of claim 1 wherein said plurality of initial fins are made of substantially pure silicon, said initial strain is a tensile strain, said first FinFET device is an N-type FinFET device and said second FinFET device is a P-type FinFET device.

4. The method of claim 1, wherein said cut second fin is in a substantially relaxed condition along a current transport direction of said cut second fin.

5. The method of claim 1, wherein said first amount is at least 65% of said initial strain and said second amount is at most 40% of said initial strain.

6. The method of claim 1, wherein said plurality of initial fins are comprised of silicon germanium with a germanium concentration of at least 50%.

7. The method of claim 1, wherein said first axial length of said cut first fin may fall within a range of about 300-1000 nm and said second axial length of said cut second fin may fall within a range of about 50-250 nm.

8. The method of claim 1, wherein said first axial length of said cut first fin is at least about three times greater than said second axial length of said cut second fin.

9. The method of claim 1, wherein said first gate structure and said second gate structure are one of final gate structures or sacrificial gate structures.

10. A method, comprising:
forming a plurality of fin-formation trenches in a substrate to define a plurality of substrate fins;
over-filling said plurality of fin-formation trenches with an insulating material;
performing a recess etching process on said plurality of substrate fins to remove portions of said substrate fins and thereby define a plurality of recessed substrate fins and a fin cavity above each of said recessed substrate fins that is bounded by said insulting material;
forming a strain relaxed buffer material in each of said fin cavities on said recessed substrate fins; and
forming a plurality of initial fins in each of said fin cavities on said strain relaxed buffer material, said plurality of initial fins having a same initial axial length and a same initial strain along a current transport direction of said plurality of initial fins;
performing at least one etching process so as to cut a first fin to a first axial length and to cut a second fin to a second axial length that is less than said first axial length, wherein said cut first fin retains between about 65-90% of said initial strain and said cut second fin retains 0-40% of said initial strain, and wherein said cut second fin is in a substantially relaxed condition along a current transport direction of said cut second fin;
forming a first gate structure for a first FinFET device around a portion of said cut first fin; and
forming a second gate structure for a second FinFET device around a portion of said cut second fin.

11. The method of claim 10, wherein said plurality of initial fins are comprised of silicon germanium with a germanium concentration of at least 50%.

12. The method of claim 10, wherein said first axial length of said cut first fin is at least about three times greater than said second axial length of said cut second fin.

13. A method, comprising:
forming a plurality of fin-formation trenches in a substrate to define a plurality of substrate fins;
over-filling said plurality of fin-formation trenches with an insulating material;
performing a recess etching process on said plurality of substrate fins to remove portions of said substrate fins and thereby define a plurality of recessed substrate fins and a fin cavity above each of said recessed substrate fins that is bounded by said insulting material;
forming a strain relaxed buffer material in each of said fin cavities on said recessed substrate fins; and
forming a plurality of initial germanium containing fins in each of said fin cavities on said strain relaxed buffer material, said plurality of initial germanium-containing fins having a same initial axial length and a same initial compressive strain along a current transport direction of said plurality of initial germanium-containing fins, wherein a first and a second of said plurality of initial germanium-containing fins are intended for the formation of at least one P-type FinFET device and at least one N-type FinFET device, respectively;
performing at least one etching process so as to cut said first fin to a first axial length and to cut said second fin to a second axial length that is less than said first axial length, wherein said cut first fin retains about 65-90% of said initial compressive strain and said cut second fin retains about 0-40% of said initial compressive strain;
forming at least one first gate structure for said at least one P-type FinFET device around a portion of said cut first fin; and
forming at least one second gate structure for said at least one N-type FinFET device around a portion of said cut second fin.

14. The method of claim 13, wherein said cut second fin is in a substantially relaxed condition along a current transport direction of said cut second fin.

15. The method of claim 14, wherein said plurality of initial germanium-containing fins are comprised of at least 50% germanium.

16. The method of claim 15, wherein said first axial length of said cut first fin is at least about three times greater than said second axial length of said cut second fin.

17. A method, comprising:
forming a plurality of fin-formation trenches in a substrate to define a plurality of substrate fins;
over-filling said plurality of fin-formation trenches with an insulating material;
performing a recess etching process on said plurality of substrate fins to remove portions of said substrate fins and thereby define a plurality of recessed substrate fins and a fin cavity above each of said recessed substrate fins that is bounded by said insulting material;
forming a strain relaxed buffer material in each of said fin cavities on said recessed substrate fins; and
forming a plurality of initial silicon fins in each of said fin cavities on said strain relaxed buffer material, said plurality of initial silicon fins having a same initial axial length and a same initial tensile strain along a current transport direction of said plurality of initial silicon fins, wherein a first and a second of said initial silicon fins are intended for the formation of at least one N-type FinFET device and at least one P-type FinFET device, respectively;
performing at least one etching process so as to cut said first fin to a first axial length and to cut said second fin to a second axial length that is less than said first axial length, wherein said cut first fin retains about 65-90% of said initial tensile strain and said cut second fin retains about 0-40% of said initial tensile strain;
forming at least one first gate structure for said at least one N-type FinFET device around a portion of said cut first fin; and
forming at least one second gate structure for said at least one P-type FinFET device around a portion of said cut second fin.

18. The method of claim 17, wherein said cut second fin is in a substantially relaxed condition along a current transport direction of said cut second fin.

19. The method of claim 17, wherein said first axial length of said cut first fin is at least about three times greater than said second axial length of said cut second fin.

\* \* \* \* \*

UNITED STATES PATENT AND TRADEMARK OFFICE
CERTIFICATE OF CORRECTION

PATENT NO. : 9,589,849 B2  
APPLICATION NO. : 14/633353  
DATED : March 7, 2017  
INVENTOR(S) : Ajey Poovannummoottil Jacob et al.

Page 1 of 1

It is certified that error appears in the above-identified patent and that said Letters Patent is hereby corrected as shown below:

In the Claims

Column 12, Line 32 (Claim 1, Line 5), change "insulting" to -- insulating --.

Column 12, Line 37 (Claim 1, Line 10), change "insulting" to -- insulating --.

Column 13, Line 30 (Claim 10, Line 10), change "insulting" to -- insulating --.

Column 13, Line 65 (Claim 13, Line 10), change "insulting" to -- insulating --.

Column 13, Line 41 (Claim 17, Line 10), change "insulting" to -- insulating --.

Signed and Sealed this  
Fourth Day of July, 2017

Joseph Matal  
*Performing the Functions and Duties of the*  
*Under Secretary of Commerce for Intellectual Property and*  
*Director of the United States Patent and Trademark Office*